(12) United States Patent
Kim (10) Patent No.: US 7,945,723 B2
(45) Date of Patent: May 17, 2011

(54) APPARATUS AND METHOD OF MANAGING MAPPING TABLE OF NON-VOLATILE MEMORY

(75) Inventor: Hyo-Jun Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 624 days.

(21) Appl. No.: 11/947,162

(22) Filed: Nov. 29, 2007

(65) Prior Publication Data

US 2008/0288743 A1 Nov. 20, 2008

(30) Foreign Application Priority Data

May 18, 2007 (KR) .................. 10-2007-0048832

(51) Int. Cl.
- *G06F 13/00* (2006.01)
- *G06F 13/28* (2006.01)
- *G11C 11/34* (2006.01)
- *G11C 16/04* (2006.01)
- *G11C 7/00* (2006.01)
- *G11C 7/22* (2006.01)

(52) U.S. Cl. ............... 711/103; 365/185.03; 365/189.16
(58) Field of Classification Search ................... 711/103
See application file for complete search history.

(56) References Cited

U.S. PATENT DOCUMENTS

| 2002/0051394 A1* | 5/2002 | Tobita et al. .................. 365/221 |
| 2008/0104309 A1* | 5/2008 | Cheon et al. .................. 711/103 |
| 2008/0246857 A1* | 10/2008 | Hayashi et al. ............ 348/231.9 |

* cited by examiner

*Primary Examiner* — Hetul Patel
*Assistant Examiner* — Edward J Dudek, Jr.
(74) *Attorney, Agent, or Firm* — Sughrue Mion, PLLC

(57) ABSTRACT

An apparatus and method for managing a mapping table of a non-volatile memory are provided. The apparatus includes a non-volatile memory having memory cells, each of which stores data bits in a plurality of pages included in a block according to a plurality of states, each of which has at least two bits, an operating time measuring unit measuring a write operation time on each of the plurality of pages included in the block, and a mapping table generating unit dividing the pages into a plurality of groups according to the measured write operation time and generating a mapping table by using the divided groups.

6 Claims, 8 Drawing Sheets

| LSB PAGE | 1 | 0 | 0 | 1 |
|---|---|---|---|---|
| MSB PAGE | 1 | 1 | 0 | 0 |

PAGE NUMBER

| 0 | LSB PAGE 0 |
|---|---|
| 1 | LSB PAGE 1 |
| 2 | MSB PAGE 0 |
| 3 | LSB PAGE 2 |
| 4 | MSB PAGE 1 |
| 5 | LSB PAGE 3 |
| 6 | MSB PAGE 2 |
| 7 | MSB PAGE 3 |

FIG. 5

| LSB PAGE 0 |
| LSB PAGE 1 |
| LSB PAGE 2 |
| LSB PAGE 3 |

FIG. 6

| MSB PAGE 0 |
| MSB PAGE 1 |
| MSB PAGE 2 |
| MSB PAGE 3 |

APPARATUS AND METHOD OF MANAGING MAPPING TABLE OF NON-VOLATILE MEMORY

CROSS REFERENCE TO RELATED APPLICATION

This application claims priority from Korean Patent Application No. 10-2007-0048832 filed on May 18, 2007 in the Korean Intellectual Property Office, the disclosure of which is incorporated herein by reference in its entirety.

BACKGROUND OF THE INVENTION

1. Field of the Invention

Apparatuses and methods consistent with the present invention relate to managing a mapping table of a non-volatile memory, and more particularly, to managing a mapping table of a non-volatile memory that can show a mapping relationship between a plurality of pages sharing a memory cell in a non-volatile memory that can express bit information of the plurality of pages by using one memory cell.

2. Description of the Related Art

In general, embedded systems, such as home appliances, communication apparatuses, and set-top boxes, use non-volatile memories as storage media that store and process data.

A flash memory, which is widely used among non-volatile memories, is a non-volatile memory device that can electrically delete or rewrite data. The flash memory has lower power consumption as compared with a storage medium based on a magnetic disk memory. Further, the flash memory has a small size, and a quick access time like a hard disk. Therefore, the flash memory is appropriate for a portable apparatus.

The basic mechanism by which data bits are stored in the non-volatile memory is a memory cell. The memory cell is composed of a single field effect transistor that includes a control gate, a floating gate, a source, and a drain. At this time, the amount of charge on the floating gate is changed to change a threshold voltage of the memory cell. In this way, the data bits are stored. Further, the memory cell is read by applying a selection voltage through a word line of the control gate.

A general memory cell provides storage capacity that two types of states are stored by using one bit. That is, the memory cell provides the storage capacity for storing a bit 1 indicating a state in which data is erased or a bit 0 indicating a state in which data is stored according to a voltage that is applied.

At this time, since a mass storage device needs to provide a bit at low cost, researches on technologies that enable storing data corresponding to a plurality of bits in one memory cell have been actively made.

A technology capable of remarkably reducing the cost per bit in a non-volatile memory, which is entitled with "A multilevel-Cell 32 Mb Flash Memory", is disclosed in International Solid-State Circuits Conference (ISSCC) Digest of Technical Papers, pp. 132-133, the Institute of Electrical and Electronics Engineers (IEEE), February 1995 by M. Bauer et al. This paper includes a technology that provides a storage capacity with respect to four states by using two bits per memory cell.

As such, the non-volatile memory that has a storage capacity with respect to four states by using two bits per memory cell is generally called a multi-level cell (hereinafter, simply referred to as "MLC") non-volatile memory, which stores data bits corresponding to two pages by using one memory cell. Further, the two pages corresponding to the one memory cell are called a least significant bit (LSB) page and a most significant bit (MSB) page, respectively. The data bits corresponding to the LSB page are stored first.

The use of an MLC non-volatile memory causes a problem when power supply to the non-volatile memory is suddenly interrupted while a program is executed. Thus, an MLC non-volatile memory has been generally used for products that store data which are relatively not important. Even though various kinds of methods have been proposed to ensure stable operation of an MLC non-volatile memory, all of the methods can only be applied when a mapping relationship between the LSB page and the MSB page is already known.

Specifically, when an error occurs in one of the LSB page and the MSB page due to sudden interruption of power supply to an MLC non-volatile memory, an error that occurs on a different page but sharing a memory cell can be removed when the mapping relationship between the LSB page and the MSB page that share one memory cell is known.

A flash management system using only a sequential write operation is disclosed in Korean Patent Publication No. 2004-0034580. When a flash device of the flash management system performs a write operation, if a page is available for writing in the same block, the data is written to that page. Then, the page is preferably at a higher address than any previously written page in that block. However, a method of determining the mapping relationship between the LSB page and the MSB page in the MLC non-volatile memory is not disclosed in Korean Patent Publication No. 2004-0034580.

SUMMARY OF THE INVENTION

The present invention provides an apparatus and method of managing a mapping table of a non-volatile memory that finds out a mapping relationship between an LSB page and an MSB page in an MLC non-volatile memory and allows various kinds of non-volatile memories to be used by one piece of software.

Aspects of the invention are not limited to those mentioned above, and other aspects of the invention will be apparently understood by those skilled in the art through the following description.

According to an aspect of the present invention, there is provided an apparatus for managing a mapping table of a non-volatile memory, the apparatus including a non-volatile memory having memory cells, each of which stores data bits in a plurality of pages included in a predetermined block according to a plurality of states, each of which has at least two bits, an operating time measuring unit measuring a write operation time on each of the plurality of pages included in the block, and a mapping table generating unit dividing the pages into a plurality of groups according to the measured write operation time and generating a mapping table by using the divided groups.

According to another aspect of the invention, there is provided a method of managing a mapping table of a non-volatile memory, the method including measuring a write operation time on each of a plurality of pages included in a predetermined block of a non-volatile memory that includes memory cells, each of which stores data bits in the plurality of pages included in the block according to a plurality of states, each of which has at least two bits, dividing the pages into a plurality of groups according to the measured write operation time, and generating a mapping table by using the divided groups.

BRIEF DESCRIPTION OF THE DRAWINGS

The above and other aspects of the present invention will become more apparent by describing in detail preferred embodiments thereof with reference to the attached drawings, in which.

DESCRIPTION OF EXEMPLARY EMBODIMENTS

Aspects of the present invention may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention will only be defined by the appended claims. Like reference numerals refer to like elements throughout the specification.

Hereinafter, the present invention will be described hereinafter with reference to block diagrams or flowchart illustrations of an apparatus and method of managing a mapping table of a non-volatile memory according to an exemplary embodiment thereof. It will be understood that each block of the flowchart illustrations and combinations of blocks in the flowchart illustrations can be implemented by computer program instructions. These computer program instructions can be provided to a processor of a general purpose computer, specific purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable data processing apparatus to produce a computer implemented process such that the instructions that execute on the computer or other programmable data processing apparatus provide steps for implementing the functions specified in the flowchart block or blocks.

Each block of the block diagrams may represent a module, a segment, or a portion of a code, which comprises one or more executable instructions for implementing the specified logical function(s). It should also be noted that in some alternative implementations, the functions noted in the blocks may occur out of order. For example, two blocks shown in succession may in fact be executed substantially concurrently or the blocks may sometimes be executed in reverse order depending upon the functionality involved.

Figure 1:
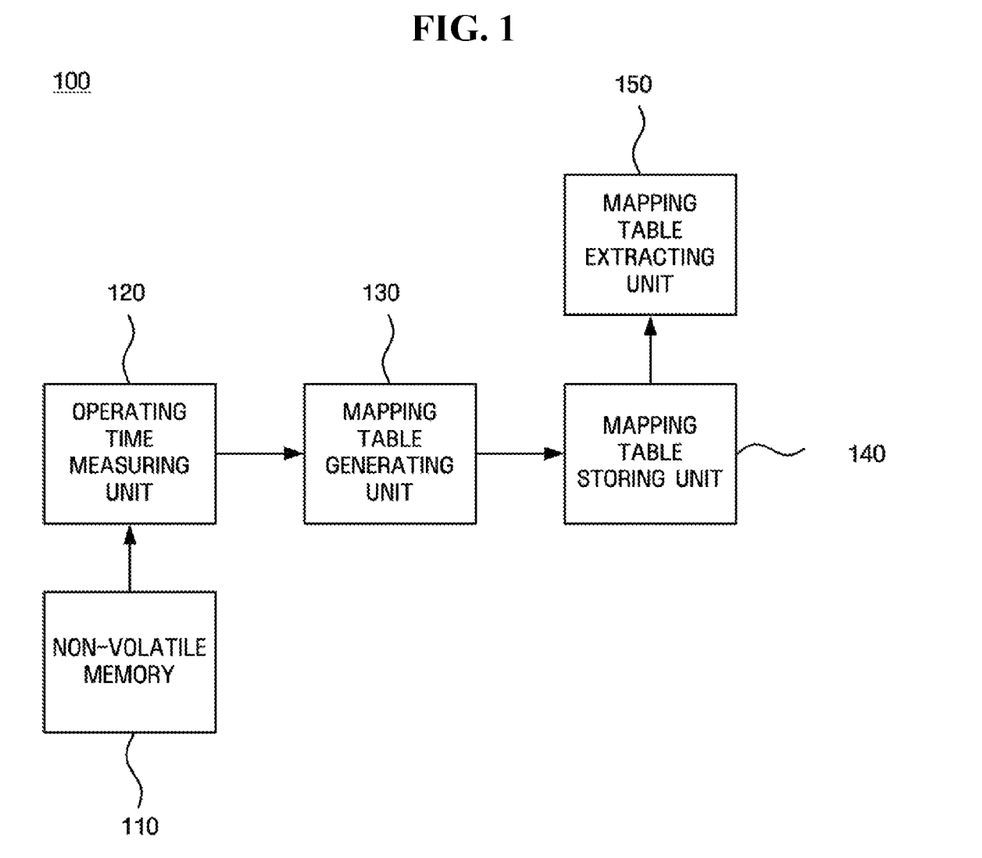
FIG. 1 is a diagram illustrating an apparatus for managing a mapping table of a non-volatile memory according to an exemplary embodiment of the invention.

FIG. 1 is a diagram illustrating an apparatus for managing a mapping table of a non-volatile memory according to an exemplary embodiment of the invention.

As shown in FIG. 1, an apparatus for managing a mapping table 100 of a non-volatile memory according to an exemplary embodiment of the present invention includes a non-volatile memory 110, an operating time measuring unit 120, a mapping table generating unit 130, a mapping table storing unit 140, and a mapping table extracting unit 150.

A description will be made of a case when the non-volatile memory 110 includes an MLC non-volatile memory that includes memory cells, each of which stores data in a plurality of pages according to a plurality of states, each of which has at least two bits.

For example, when a memory cell of an MLC non-volatile memory stores data in a plurality of pages by using two bits, the pages where data bits are stored by using the same memory cell are bound to each other, and the memory cell can store the data in an LSB page and an MSB page, which are bound to each other, among the pages included in a predetermined block. At this time, the LSB page and the MSB page may be sequentially positioned or not. Further, according to the exemplary embodiment of the invention, the description is made of a case where the memory cell stores data bit information according to the four states, each of which has two bits. However, the invention is not limited thereto. The memory cell may store data bits in a plurality of pages according to a plurality of states, each of which includes two or more bits.

The operating time measuring unit 120 performs a write operation on each of the plurality of pages included in the predetermined block of the non-volatile memory 110 and measures a time required until the write operation on each of the pages is completed. As described above, when the non-volatile memory 110 includes the MLC non-volatile memory, a difference occurs between a time required until a write operation on the LSB page is completed and a time required until a write operation on the MSB page is completed. In order to determine the time difference, the operating time measuring unit 120 measures the time required until the write operation on each of the pages is completed.

Figure 2:
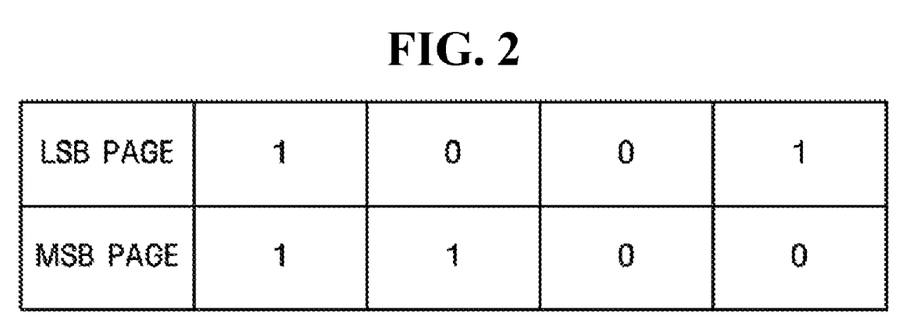
FIG. 2 is a diagram illustrating states of an MLC non-volatile memory according to an exemplary embodiment of the present invention.
Figure 3:
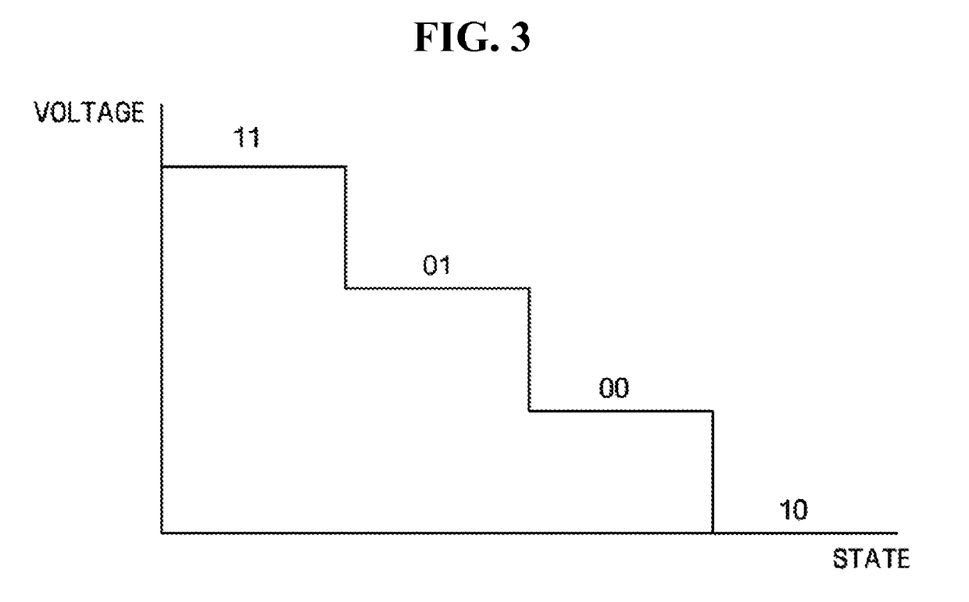
FIG. 3 is a diagram illustrating a voltage according to the states shown in FIG. 2, according to an exemplary embodiment of the present invention.

For example, as shown in FIG. 2, when the memory cell of the non-volatile memory 110 stores the data bit information in the LSB page and the MSB page according to the four states, each of which has two bits, the four states of the LSB page and the MSB page can be obtained according to four levels of voltage, as shown in FIG. 3.

At this time, referring to FIGS. 2 and 3, the voltage of the LSB page is reduced by one level, while the voltage of the MSB page is reduced by two or more levels. Therefore, the time required until the write operation on the LSB page is completed is shorter than the time required until the write operation on the MSB page is completed. That is, the operating time measuring unit 120 measures the time required until the write operation on each of the pages is completed, such that the LSB page and the MSB page can be differentiated from each other in the non-volatile memory 110.

The mapping table generating unit 130 divides the pages in the block into a first group, which is an LSB page group, and a second group, which is an MSB page group, according to the write operation completion time of each of the pages that is measured by the operating time measuring unit 120. Further, the mapping table generating unit 130 can generate a mapping table that describes a mapping relationship between the LSB page and the MSB page by using the first group and the second group.

Figure 4:
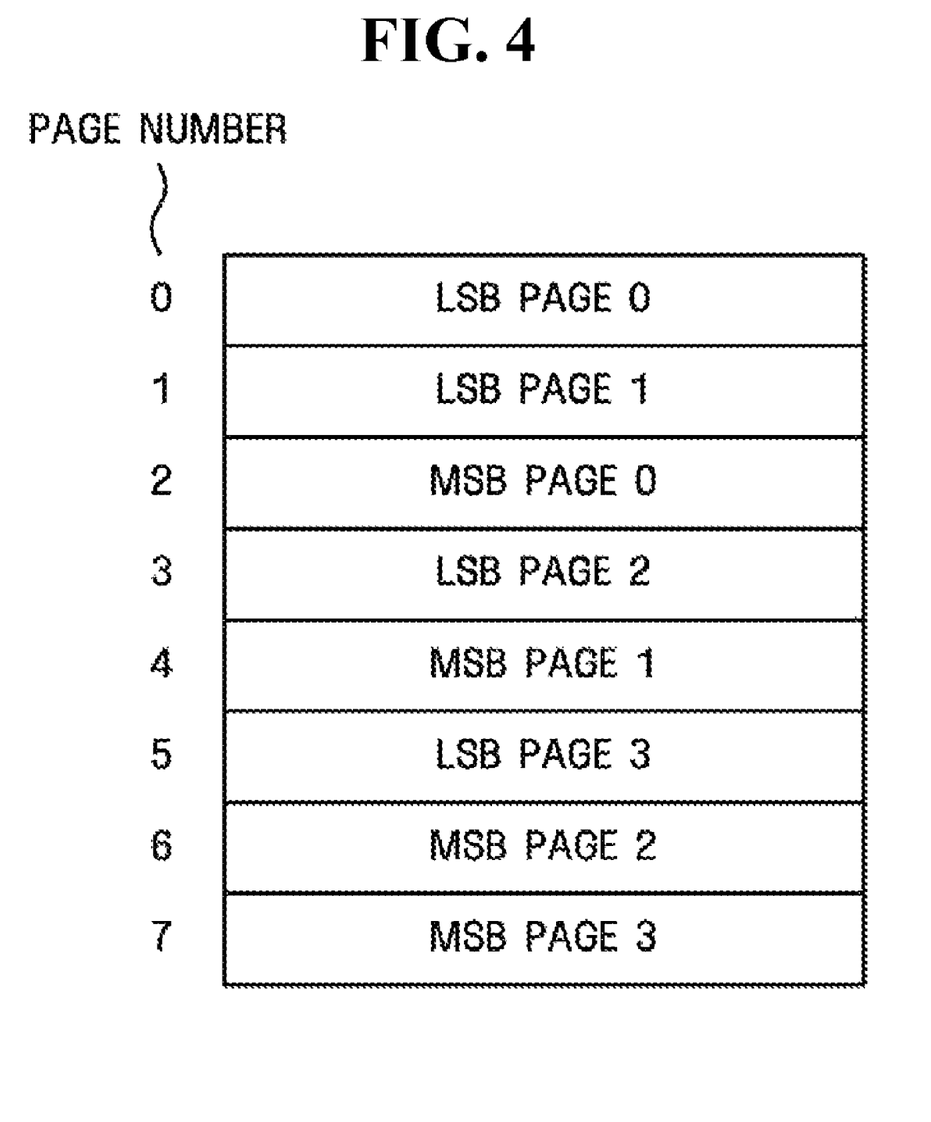
FIG. 4 is a diagram illustrating the structure of pages that are included in a block of a non-volatile memory according to an exemplary embodiment of the present invention.
Figure 5:
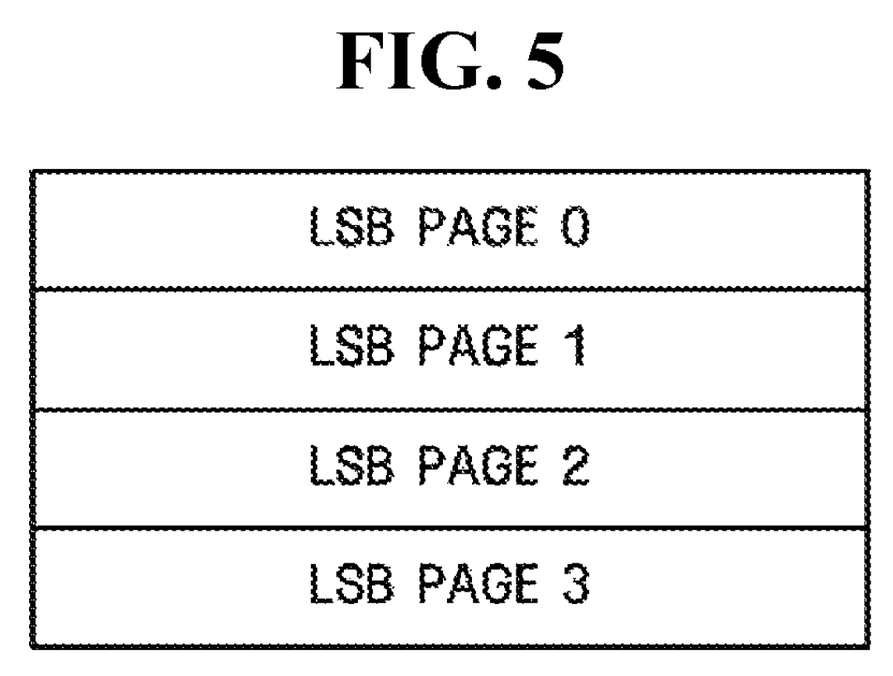
FIG. 5 is a diagram illustrating a first group according to an exemplary embodiment of the present invention.
Figure 6:
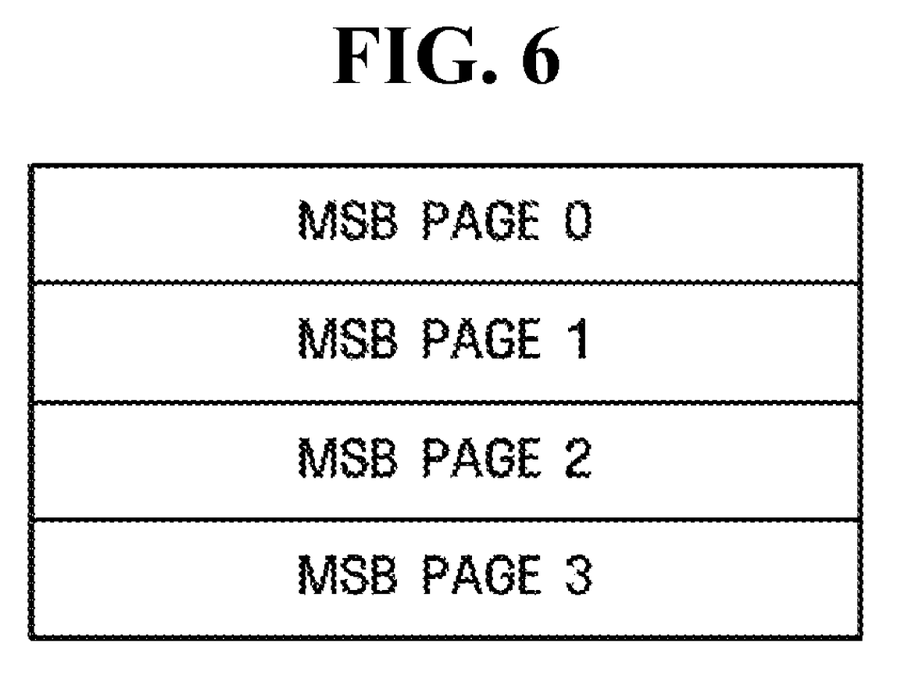
FIG. 6 is a diagram illustrating a second group according to an exemplary embodiment of the present invention.

Specifically, when the non-volatile memory 110 includes LSB pages 0 to 3 and MSB pages 0 to 3 as shown in FIG. 4, the operating time measuring unit 120 measures a time required when a write operation on each of the pages is completed. Then, the mapping table generating unit 130 divides the pages into a first group consisting of the LSB pages shown in FIG. 5 and a second group consisting of the MSB pages shown in FIG. 6 according to the measured write operation completion time. At this time, the pages in each of the first group and the second group are sequentially arranged because according to a characteristic of the non-volatile memory 110, the pages in the block are sequentially programmed in a direction where a page number increases.

Figure 7:
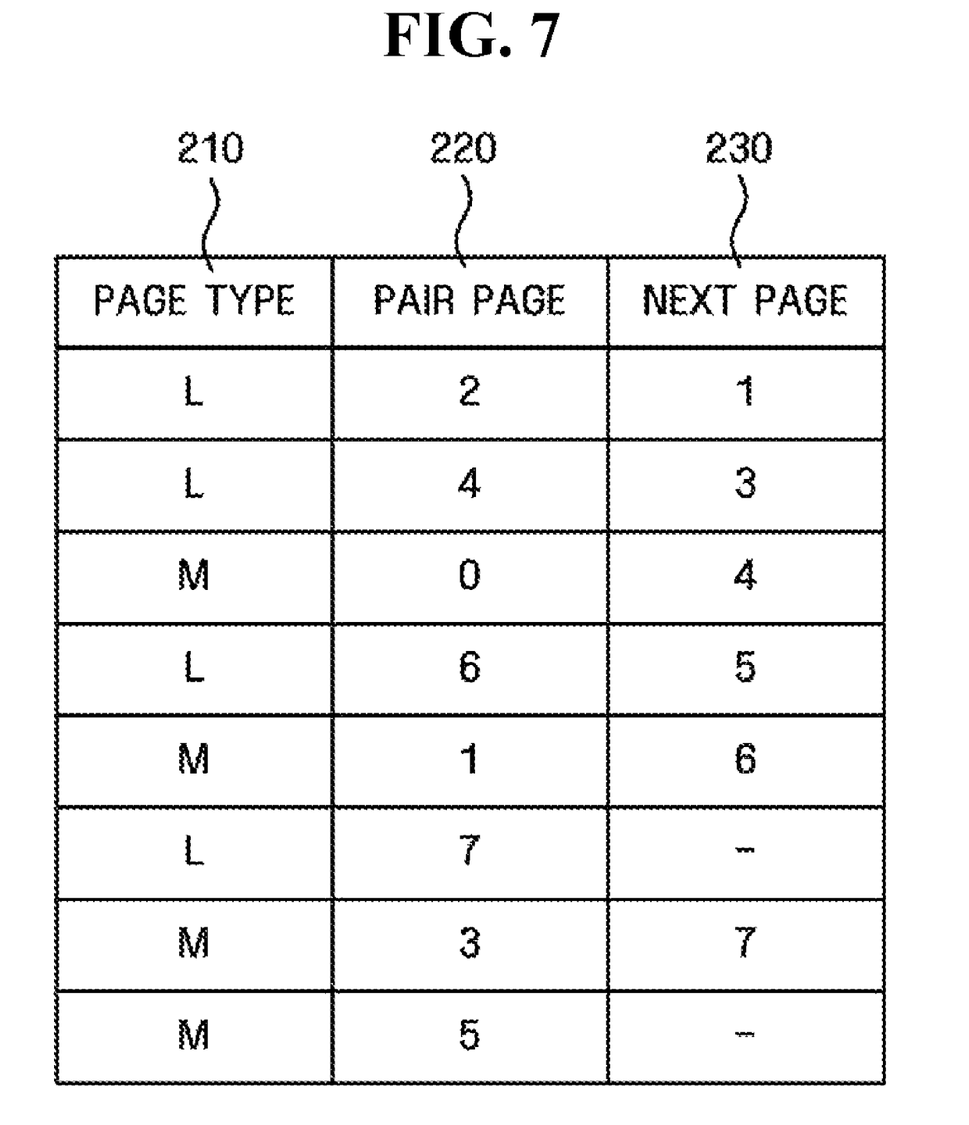
FIG. 7 is a diagram illustrating a mapping table according to an exemplary embodiment of the present invention.

Then, the mapping table generating unit 130 generates a mapping table by using the first group and the second group. In the exemplary embodiment of the invention, the description will be made of a case where the generated mapping table includes a page type field 210, a pair page field 220, and a next page field 230, as shown in FIG. 7. However, the invention is not limited thereto. Further, it can be understood that the mapping table according to the exemplary embodiment of the invention is generated to determine the mapping relationship between the pages that share the memory cell. Therefore, it can be understood by those skilled in the art that the number and type of the fields included in the mapping table can be changed according to the type and specifications of the non-volatile memory 110.

The page type field 210 indicates whether a corresponding page is an LSB page or an MSB page. Reference character "L" refers to an LSB page, and reference character "M" refers to an MSB page. The pair page field 220 indicates a page that shares a memory cell with the corresponding page. That is, when the corresponding page is an LSB page, the pair page field 220 indicates an MSB page that shares the memory cell, and when the corresponding page is an MSB page, the pair page field 220 indicates an LSB page that shares the memory cell. The next page field 230 has the same page type as the corresponding page, and indicates a next page. Further, in FIG. 7, "-" means that there is no next page.

The mapping table storing unit 140 stores the mapping table that is generated by the mapping table generating unit 130. According to the exemplary embodiment of the invention, the description is made of a case where the non-volatile memory 110 and the mapping table storing unit 140 are different components from each other. However, the invention is not limited thereto. The mapping table storing unit 140 may be replaced by a predetermined region of the non-volatile memory 110.

The mapping table extracting unit 150 extracts the mapping table stored in the mapping table storing unit 140. When various types of non-volatile memories 110 are used by using one piece of software, the mapping relationship between the pages that share the memory cell of the MLC non-volatile memory can be determined by extracting the mapping table. Accordingly, unnecessary time and costs to modify firmware according to the structures of the MLC non-volatile memories can be removed.

Figure 8:
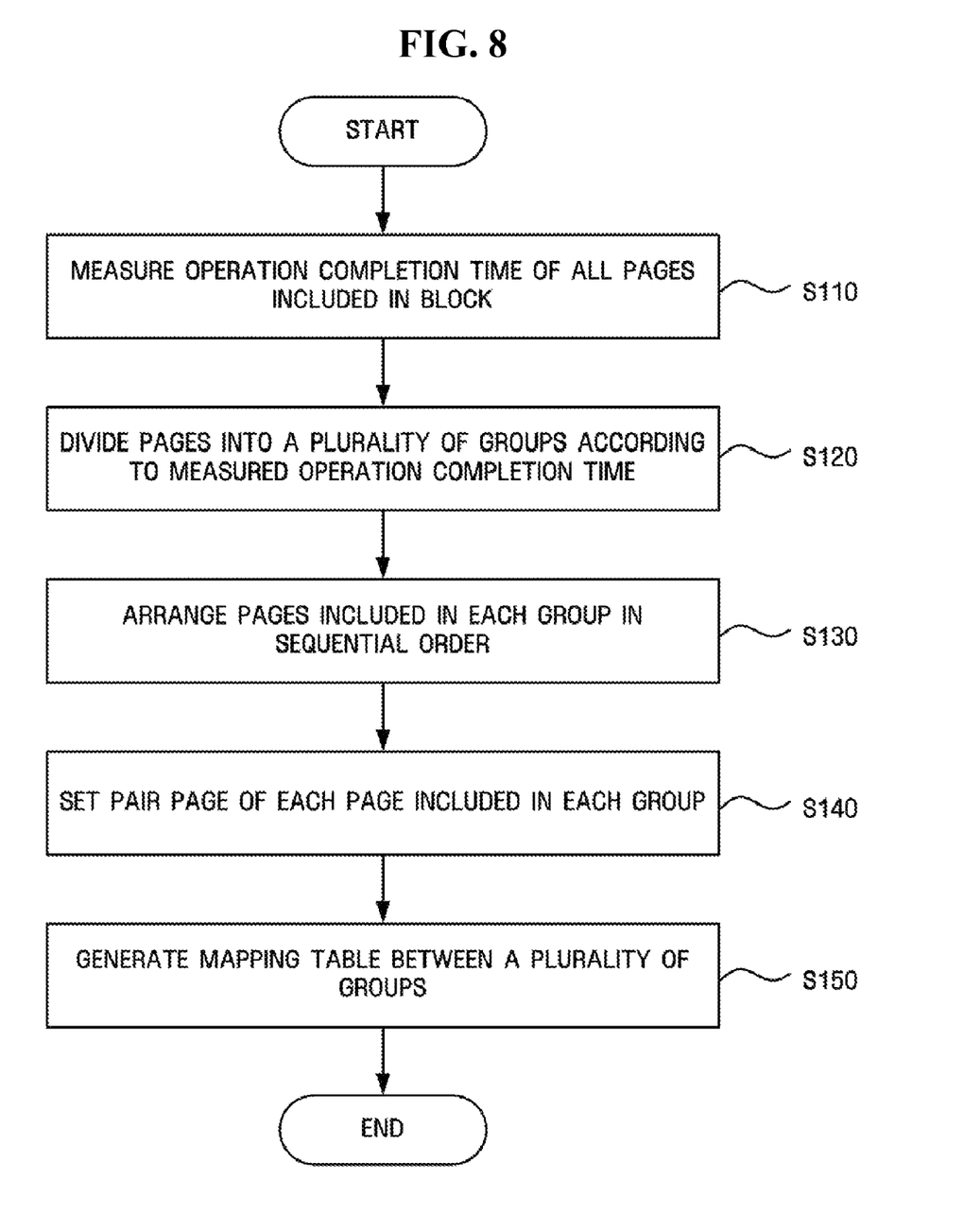
FIG. 8 is a diagram illustrating a method of managing a mapping table of a non-volatile memory according to an exemplary embodiment of the present invention.

FIG. 8 is a diagram illustrating a method of managing a mapping table of a non-volatile memory according to an exemplary embodiment of the present invention.

As shown in FIG. 8, according to a method of managing a mapping table of a non-volatile memory according to an exemplary embodiment of the invention, the operating time measuring unit 120 performs a write operation on each of the pages of the predetermined block included in the non-volatile memory 110 and measures a time required until the write operation on each of the pages is completed (S110).

The mapping table generating unit 130 divides the pages included in the corresponding block into a plurality of groups according to the write operation completion time of each of the pages that is measured by the operating time measuring unit 120 (S120). At this time, the description will be made of a case where the predetermined block of the non-volatile memory 110 includes eight pages, which include four LSB pages and four MSB pages. Further, the groups divided by the mapping table generating unit 130 are divided into, for example, a first group consisting of the LSB pages and a second group consisting of the MSB pages. At this time, the plurality of pages are divided into the first group and the second group on the basis of a fact that a program ends in the LSB page in a relatively shorter time as compared with the MSB page. The pages are divided into the first group and the second group on the basis of a reference time that is determined according to the time when the program ends in the LSB page.

At this time, according to a method of dividing groups in the mapping table generating unit 130, pages whose write operation is completed in a relatively shorter time as compared with other pages are set as LSB pages and grouped into a first group, and the other pages are set to MSB pages and grouped into a second group.

When the pages are divided into the groups, the mapping table generating unit 130 arranges the pages included in the corresponding groups in a sequential order (S130).

The mapping table generating unit 130 sets a pair page with respect to each of the pages included in each of the groups on the basis of the arranged pages (S140).

As shown in FIG. 7, the mapping table generating unit 130 generates a mapping table between the plurality of groups (S150).

At this time, if the above-described method shown in FIG. 8 is performed whenever the non-volatile memory 110 is initialized, efficiency thereof may be reduced. Therefore, the mapping table generated according to the above-described method shown in FIG. 8 may be stored in the mapping table storing unit 140. If necessary, the mapping table may be extracted by the mapping table extracting unit 150 and used.

As such, the MLC non-volatile memory, which can express bit information on the plurality of pages by using one memory cell, stores the mapping relationship between the LSB page and the MSB page as the mapping table and uses the mapping table. Therefore, various types of non-volatile memories can be used by using one piece of software. That is, when manufacturers provide MLC non-volatile memories that have different structures, additional costs for development, such as modifying firmware according to the structures of the non-volatile memories, can be reduced.

The term "unit" according to the exemplary embodiment of the invention, means, but is not limited to, a software or hardware component, such as a Field Programmable Gate Array (FPGA) or Application Specific Integrated Circuit (ASIC), which performs certain tasks. A module may advantageously be configured to reside on the addressable storage medium and configured to execute on one or more processors.

Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules. In addition, the components and modules may be implemented such that they execute one or more central processing units (CPUs) in a device or a secure multimedia card.

Although the present invention has been described in connection with the exemplary embodiments of the present invention, it will be apparent to those skilled in the art that various modifications and changes may be made thereto without departing from the scope and spirit of the present invention. Therefore, it should be understood that the above exemplary embodiments are not limitative, but illustrative in all aspects.

As described above, according to the apparatus and method of managing a mapping table of the non-volatile memory according to the exemplary embodiments of the invention, the following effects can be obtained.

The MLC non-volatile memory recognizes the mapping relationship between the LSB page and the MSB page, stores the mapping relationship as the mapping table, and uses the mapping table. Therefore, various types of non-volatile memories can be used by using one piece of software.

Further, the generation of the mapping table leads to a reduction in unnecessary development costs and time, such as modifying firmware and software according to the structures of the non-volatile memories.

What is claimed is:

1. An apparatus for managing a mapping table of a non-volatile memory, the apparatus comprising:
   a non-volatile memory that comprises memory cells, each of which stores data bits in a plurality of pages included in a block according to a plurality of states, each of the plurality of states having at least two bits;
   an operating time measuring unit that measures write operation times on the plurality of pages included in the blocks; and
   a mapping table generating unit that divides the plurality of pages into a plurality of groups according to the measured write operation times and generates a mapping table by using the plurality of groups,
   wherein the mapping table generating unit generates the mapping table that comprises a type field of a page of the plurality of pages, a pair page field of the page, and a next page field of the page.

2. The apparatus of claim 1, wherein the type field of the page indicates whether a certain page of the plurality of pages is a least significant bit (LSB) page or a most significant bit (MSB) page of the plurality of pages,
   wherein the pair field of the page indicates a page that shares a memory cell of the plurality of memory cells with the certain page, and
   wherein the next page field of the page indicates a next page having a same type as the certain page, between the LSB page and the MSB page.

3. The apparatus of claim 2, wherein if the certain page is the MSB page, the page that shares the memory cell with the certain page is the LSB page, and
   wherein if the certain page is the LSB page, the page that shares the memory cell with the certain page is the MSB page.

4. A method of managing a mapping table of a non-volatile memory, the method comprising:
   measuring write operation times on a plurality of pages included in a block of a non-volatile memory that comprises a plurality of memory cells, each of which stores data bits in the plurality of pages included in the blocks according to a plurality of states, each of the plurality of states having at least two bits;
   dividing the plurality of pages into a plurality of groups according to the measured write operation times; and
   generating a mapping table by using the plurality of groups,
   wherein the mapping table comprises a type field of a page of the plurality of pages, a pair page field of the page, and a next page field.

5. The method of claim 4, wherein the type field of the page indicates whether a certain page of the plurality of pages is a least significant bit (LSB) page or a most significant bit (MSB) page of the plurality of pages,
   wherein the pair field of the page indicates a page that shares a memory cell of the plurality of memory cells with the certain page, and
   wherein the next page field of the page indicates a next page having a same type as the certain page, between the LSB page and the MSB page.

6. The method of claim 5, wherein if the certain page is the MSB page, the page that shares the memory cell with the certain page is the LSB page, and
   wherein if the certain page is the LSB page, the page that shares the memory cell with the certain page is the MSB page.

* * * * *